(12) United States Patent
Iijima et al.

(10) Patent No.: US 11,456,200 B2
(45) Date of Patent: Sep. 27, 2022

(54) SUBSTRATE FIXING APPARATUS INCLUDING A BASE PLATE, AN ELECTROSTATIC ADSORPTION MEMBER, A PLURALITY OF SUPPORT MEMBERS ON THE BASE PLATE AND SUPPORTING THE ELECTROSTATIC ADSORPTION MEMBER, AND AN ADHESIVE LAYER BONDING THE ELECTROSTATIC ADSORPTION MEMBER TO THE BASE PLATE

(71) Applicant: SHINKO ELECTRIC INDUSTRIES CO., LTD., Nagano (JP)

(72) Inventors: Nobuyuki Iijima, Nagano (JP); Hiroharu Yanagisawa, Nagano (JP); Yuichi Nakamura, Nagano (JP); Ryuji Takahashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 219 days.

(21) Appl. No.: 16/896,815

(22) Filed: Jun. 9, 2020

(65) Prior Publication Data

US 2020/0395236 A1 Dec. 17, 2020

(30) Foreign Application Priority Data

Jun. 13, 2019 (JP) .............................. JP2019-110515

(51) Int. Cl.
*H01L 21/683* (2006.01)
*H01J 37/32* (2006.01)
*H01L 21/67* (2006.01)

(52) U.S. Cl.
CPC .... *H01L 21/6833* (2013.01); *H01J 37/32724* (2013.01); *H01L 21/67103* (2013.01)

(58) Field of Classification Search
CPC ......... H01L 21/67103; H01L 21/67109; H01L 21/6833; H01L 21/68757; H01L 21/68785
See application file for complete search history.

(56) References Cited

U.S. PATENT DOCUMENTS

2013/0026720 A1\* 1/2013 Hori .................... H01L 21/6833
279/128
2013/0093145 A1\* 4/2013 Hori .................. C04B 35/63436
279/128

(Continued)

FOREIGN PATENT DOCUMENTS

| JP | 2000-183143 | 6/2000 |
| JP | 2016-012608 | 1/2016 |
| JP | 2017059771 A \* | 3/2017 |

OTHER PUBLICATIONS

Ashby, Michael F. Materials and the Environment (Second Edition, 2013) pp. 459-595. Retrieved from the Internet: https://www.sciencedirect.com/topics/chemistry/soda-lime-glass (Year: 2013).\*

*Primary Examiner* — Jared Fureman
*Assistant Examiner* — Nicolas Bellido
(74) *Attorney, Agent, or Firm* — Rankin, Hill & Clark LLP

(57) ABSTRACT

A substrate fixing apparatus includes: a base plate; an electrostatic adsorption member that adsorbs and retains a substrate; a support member that is disposed on the base plate to support the electrostatic adsorption member; and an adhesive layer that adhesively bonds the electrostatic adsorption member to the base plate. The support member directly contacts the base plate and the electrostatic adsorption member. An elastic modulus of the support member is higher than an elastic modulus of the adhesive layer.

10 Claims, 6 Drawing Sheets

(56) References Cited

U.S. PATENT DOCUMENTS

| | | | |
|---|---|---|---|
| 2014/0008880 A1* | 1/2014 | Miura | H01L 21/6831 |
| | | | 279/128 |
| 2014/0042716 A1* | 2/2014 | Miura | H01L 21/67103 |
| | | | 279/128 |
| 2018/0068883 A1* | 3/2018 | Ito | C09J 183/04 |

* cited by examiner

SUBSTRATE FIXING APPARATUS INCLUDING A BASE PLATE, AN ELECTROSTATIC ADSORPTION MEMBER, A PLURALITY OF SUPPORT MEMBERS ON THE BASE PLATE AND SUPPORTING THE ELECTROSTATIC ADSORPTION MEMBER, AND AN ADHESIVE LAYER BONDING THE ELECTROSTATIC ADSORPTION MEMBER TO THE BASE PLATE

This application claims priority from Japanese Patent Applications No. 2019-110515, filed on Jun. 13, 2019, the entire contents of which are herein incorporated by reference.

BACKGROUND

1. Technical Field

The present disclosure relates to substrate fixing apparatus.

2. Background Art

Generally, in a method for manufacturing a substrate fixing apparatus, an electrostatic adsorption member is adhesively bonded to a base plate by use of an adhesive layer. During the adhesive bonding, a structure body formed by the base plate, the adhesive layer and the electrostatic adsorption member is placed on a surface plate so as to bring an adsorption face of the electrostatic adsorption member into contact with the surface plate, and a load is then applied to a lower face of the base plate. In addition, a spacer is provided outside the adhesive layer in plan view between the base plate and the surface plate so as to make the lower face of the base plate and the adsorption face of the electrostatic adsorption member in parallel with each other (see e.g., JP-A-2000-183143 and JP-A-2016-012608).

However, in the substrate fixing apparatus manufactured by the aforementioned method, it may be unable to obtain a satisfactory uniform temperature characteristic in the adsorption face of the electrostatic adsorption member. That is, a variation may be caused in the temperature of the adsorption face of the electrostatic adsorption member.

SUMMARY

Certain embodiments provide a substrate fixing apparatus. The substrate fixing apparatus includes: a base plate; an electrostatic adsorption member that adsorbs and retains a substrate; a support member that is disposed on the base plate to support the electrostatic adsorption member; and an adhesive layer that adhesively bonds the electrostatic adsorption member to the base plate. The support member directly contacts the base plate and the electrostatic adsorption member. An elastic modulus of the support member is higher than an elastic modulus of the adhesive layer.

DESCRIPTION OF EMBODIMENT

The present inventors have made intensive studies in order to look deep into the cause of the variation of the temperature in the absorption face of the electrostatic absorption member in the background-art substrate fixing apparatus. As a result, it has become clear that thickness of the electrostatic adsorption member may be uneven, and in such a case, inplane uniformity of thickness of the adhesive layer is impaired to thereby result in the variation of the temperature in the adsorption face of the electrostatic adsorption member.

The present disclosure has been accomplished based on such a finding. The present disclosure is to improve inplane uniformity of thickness of an adhesive layer and improve uniformity of temperature of an adsorption face of an electrostatic adsorption member even when thickness of the electrostatic adsorption member is uneven.

An embodiment of the present disclosure will be specifically described below with reference to the accompanying drawings. Incidentally, since constituent elements having substantially the same functional configurations in the description of the present disclosure and the drawings are referred to by the same signs correspondingly and respectively, duplicate description about the constituent elements may be omitted.

[Structure of Substrate Fixing Apparatus]

Figure 1:
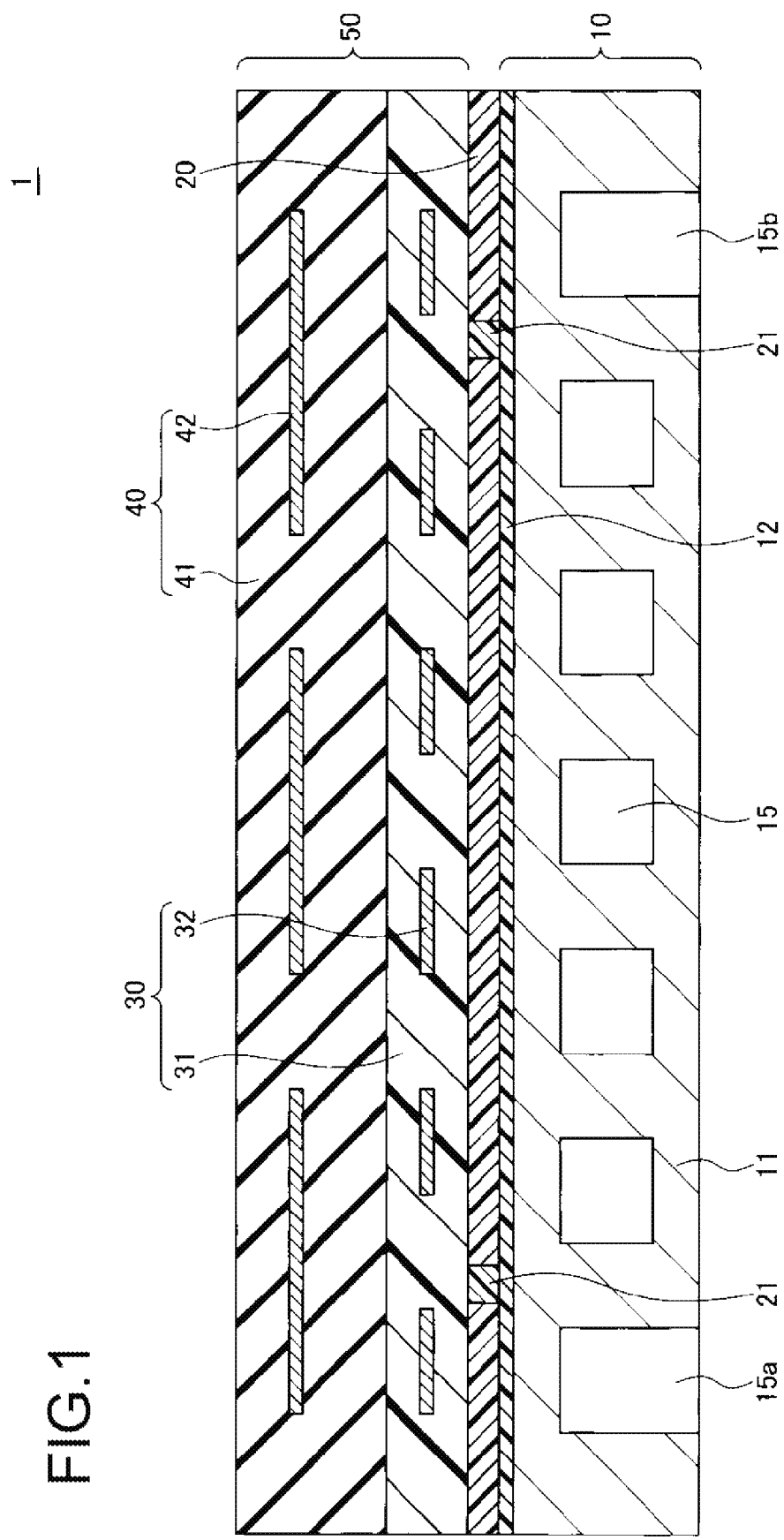
FIG. 1 is a sectional view illustrating a substrate fixing apparatus according to an embodiment in a simplified manner.

FIG. 1 is a sectional view illustrating a substrate fixing apparatus according to an embodiment in a simplified manner. With reference to FIG. 1, the substrate fixing apparatus 1 has a base plate 10, an adhesive layer 20, support column structure bodies 21 and an electrostatic adsorption member 50, as main constituent elements.

The base plate 10 is a member for mounting the electrostatic adsorption member 50 thereon. For example, the base plate 10 has a metal plate 11, and a resin layer 12 which is provided on the metal plate 11. The metal plate 11 can be made to be, for example, about 20 mm to 50 mm thick. The metal plate 11 is, for example, formed from aluminum, and may be also used as an electrode etc. for controlling plasma. Energy for making ions etc. generated in a plasma state collide against a substrate such as a wafer adsorbed on the electrostatic adsorption member 50 can be controlled by predetermined high-frequency power fed to the metal plate 11 so that the substrate can be etched effectively.

A water passage 15 is provided inside the metal plate 11. A cooling water introducing portion 15a is provided at one end of the water passage 15, and a cooling water discharging portion 15b is provided at the other end of the water passage 15. The water passage 15 is connected to a cooling water controlling apparatus (not shown) provided outside the substrate fixing apparatus 1. The cooling water controlling apparatus (not shown) introduces cooling water into the water passage 15 from the cooling water introducing portion 15a, and discharges the cooling water from the cooling water discharging portion 15b. The cooling water is circulated in the water passage 15 to cool the metal plate 11. Thus, the substrate adsorbed on the electrostatic adsorption member 50 can be cooled. A gas passage or the like for introducing inert gas to cool the substrate adsorbed on the electrostatic adsorption member 50 may be provided as well as the water passage 15 in the metal plate 11.

The resin layer 12 is used for adjustment of thermal resistance of the substrate fixing apparatus 1. The resin layer 12 may be dispensed with.

The electrostatic adsorption member 50 has a heating portion 30 and an electrostatic chuck 40 to adsorb and retain the substrate such as the wafer which is a target to be adsorbed.

The heating portion 30 has an insulating layer 31, and heat generating elements 32 which are built in the insulating layer 31. Each of the heat generating elements 32 is covered with the insulating layer 31 to be protected from the outside. A rolled alloy is preferably used as the material of the heat generating elements 32. By use of the rolled alloy, a variation among thicknesses of the heat generating elements 32 can be reduced so that a heat generation distribution can be improved. Incidentally, the heat generating elements 32 do not always have to be built in a thicknesswise central portion of the insulating layer 31 but may be distributed unevenly on the base plate 10 side or the electrostatic chuck 40 side with respect to the thicknesswise central portion of the insulating layer 31 according to requirement specification.

Specific resistance of each of the heat generating elements 32 is preferably in the range of from 10 μΩ/cm to 70 μΩ/cm, more preferably in the range of from 10 μΩ/cm to 50 μΩ/cm. If an NiCr-based heat generating element whose specific resistance is about 100 μΩ/cm were used, the wiring would be 1 to 2 mm wide and about 50 μm thick in 20Ω to 50Ω wiring design so as to make it difficult to obtain a finer pattern of the heat generating element. The specific resistance of the heat generating element 32 is made in the range of from 10 μΩ/cm to 70 μΩ/cm to be lower than the specific resistance of the NiCr-based heat generating element. Thus, the pattern of the heat generating element 32 can be made finer in 20Ω to 50Ω wiring design the same as or similar to the aforementioned one. Incidentally, when the specific resistance were smaller than 10 μΩ/cm, a heat generation characteristic would deteriorate unpreferably.

CN49 (constantan) (Cu/Ni/Mn/Fe alloy), Zeranin (Cu/Mn/Sn alloy), Manganin (Cu/Mn/Ni alloy), etc. can be listed as specific examples of the rolled alloy suitably used for the heat generating elements 32. Incidentally, specific resistance of CN49 (constantan) is about 50 μΩ/cm, specific resistance of Zeranin is about 29 μΩ/cm, and specific resistance of Manganin is about 44 μΩ/cm. The thickness of each of the heat generating elements 32 is preferably made to be not larger than 60 μm in consideration of wiring formability generated by etching.

For example, an epoxy resin, a bismaleimide-triazine resin, or the like, having high thermal conductivity and high thermal resistance can be used as the material of the insulating layer 31. The thermal conductivity of the insulating layer 31 is preferably made to be not lower than 3 W/(m·K). By containing fillers of alumina, aluminum nitride, or the like, in the insulating layer 31, the thermal conductivity of the insulating layer 31 can be improved. In addition, glass transition temperature (Tg) of the insulating layer 31 is preferably made to be not lower than 250° C. In addition, thickness of the insulating layer 31 is preferably made in the range of from about 100 μm to about 150 μm. A variation of the thickness of the insulating layer 31 is preferably made to be not larger than ±10%.

Incidentally, in order to improve tight adhesiveness between the heat generating elements 32 and the insulating layer 31 under high temperature, at least one face (one or both of an upper face and a lower face) of each of the heat generating elements 32 is preferably roughened. It is a matter of course that both of the upper face and the lower face of the heat generating element 32 may be roughened. In this case, a roughening method used on the upper face of the heat generating element 32 may be different from a roughening method used on the lower face of the heat generating element 32. Each of the roughening methods is not limited particularly. A method using etching, a method using coupling agent-based surface modification technology, a method using dot processing by a UV-YAG laser having a wavelength not longer than 355 nm, etc. can be exemplified as the roughening method.

The electrostatic chuck 40 adsorbs and retains the substrate such as the wafer which is the target to be adsorbed. The diameter of the substrate which is the target to be adsorbed by the electrostatic chuck 40 can be, for example, made to be about 8 inches, 12 inches, or 18 inches.

The electrostatic chuck 40 is provided on the heating portion 30. The electrostatic chuck 40 has a base body 41 and electrostatic electrodes 42. The electrostatic chuck 40 is, for example, a Johesen-Rahbek type electrostatic chuck. Incidentally, the electrostatic chuck 40 may be a Coulomb force type electrostatic chuck.

The base body 41 is a dielectric. For example, ceramics such as aluminum oxide ($Al_2O_3$) and aluminum nitride (MN) can be used as the base body 41. The base body 41 can be, for example, made to be about 1 mm to 10 mm thick. A relative dielectric constant of the base body 41 can be, for example, made to be about 9 to 10 at a frequency of 1 kHz. The electrostatic chuck 40 and the insulating layer 31 of the heating portion 30 are directly bonded to each other. Since the heating portion 30 and the electrostatic chuck 40 are bonded to each other not through an adhesive agent but directly, heat resisting temperature of the substrate fixing apparatus 1 can be improved. Although heat resisting temperature of a substrate fixing apparatus in which the heating portion 30 and the electrostatic chuck 40 are bonded to each other through an adhesive agent is about 150° C., the heat resisting temperature in the substrate fixing apparatus 1 can be made to be about 200° C.

The electrostatic electrodes 42 are thin film electrodes to be built in the base body 41. The electrostatic electrodes 42 are connected to a power supply provided outside the substrate fixing apparatus 1. When a predetermined voltage is applied to the electrostatic electrodes 42, adsorptive force generated by static electricity occurs between the electrostatic electrodes 42 and the substrate such as the wafer so that the substrate can be adsorbed and retained on the electrostatic chuck 40. The adsorptive retention force is stronger as the voltage applied to the electrostatic electrodes 42 is higher. Each of the electrostatic electrodes 42 may be a monopolar shape or a bipolar shape. For example, tungsten, molybdenum, or the like, can be used as the material of the electrostatic electrode 42.

The adhesive layer 20 adhesively bonds the heating portion 30 to the base plate 10. For example, a silicone-based adhesive agent can be used as the material of the adhesive layer 20. The adhesive layer 20 can be, for example, made to be about 0.1 mm to 3 mm thick. Thermal conductivity of the adhesive layer 20 is preferably not lower than 2 W/(m·K). The adhesive layer 20 may be formed from one layer or may be formed from a plurality of layers. For example, the adhesive layer 20 is formed into a two-layer structure in which, for example, an adhesive agent high in thermal conductivity and an adhesive agent low in elastic modulus are combined with each other. Thus, it is possible to obtain an effect of reducing stress generated from a difference in thermal expansion between the adhesive layer 20 and the metal plate 11 made of aluminum.

Each of the support column structure bodies 21 supports the electrostatic adsorption member 50 on the base plate 10. An elastic modulus of the support column structure body 21 is higher than the elastic modulus of the adhesive layer 20. The elastic modulus of the support column structure body 21 is preferably ten or more times as high as the elastic modulus of the adhesive layer 20. For example, the elastic modulus of the support column structure body 21 is not lower than several hundred MPa, and the elastic modulus of the adhesive layer 20 is not higher than several ten MPa. The support column structure body 21 can function as a spacer between the base plate 10 and the electrostatic adsorption member 50 to improve inplane uniformity of the thickness of the adhesive layer 20, The support column structure body 21 is an example of a support member.

[Method for Manufacturing Substrate Fixing Apparatus]

FIG. 2A to FIG. 5B are views illustrating a method for manufacturing the substrate fixing apparatus according to the embodiment. The method for manufacturing the substrate fixing apparatus according to the embodiment will be described with reference to FIG. 2A to FIG. 5B. Incidentally, FIG. 2A to FIG. 3B and FIG. 5A are drawn in a state that is vertically inverted to FIG. 1.

Figure 2A:
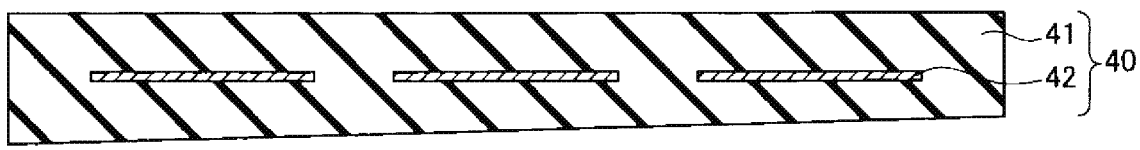
FIGS. 2A to 2D are views illustrating a method for manufacturing the substrate fixing apparatus according to the embodiment (Part 1)

First, in a step shown in FIG. 2A, an electrostatic chuck 40 in which electrostatic electrodes 42 are built in a base plate 41 is produced by a well-known manufacturing method including the steps of working vias in a green sheet, filling the vias with an electrically conductive paste, forming patterns as electrostatic electrodes, depositing and sintering another green sheet, flattening the surface, etc. Incidentally, in order to improve tight adhesiveness with an insulating resin film 311 (see FIG. 2B), a face of the electrostatic chuck 40 on which the insulating resin film 311 will be laminated may be roughened by blast treatment or the like. Thickness of the base body 41 formed thus may be uneven.

Figure 2B:
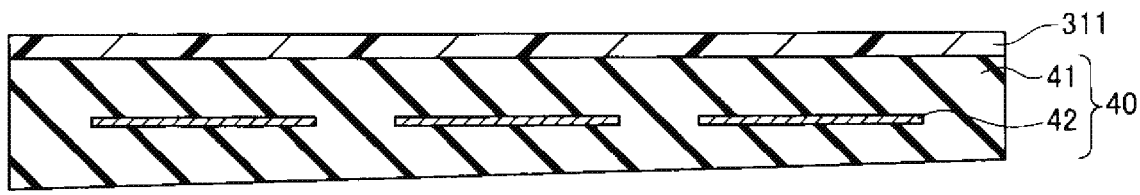

Next, in a step shown in FIG. 2B, the insulating resin film 311 is directly laminated on the electrostatic chuck 40. The insulating resin film 311 laminated in a vacuum is suitable in order to make it possible to suppress entrainment of voids. The insulating resin film 311 is not cured but kept in a semi-cured state (B-stage) in advance. The insulating resin film 311 is temporarily fixed onto the electrostatic chuck 40 by pressure-sensitive adhesive force of the insulating resin film 311 which is in the semi-cured state.

For example, an epoxy resin, a bismaleimide-triazine resin, or the like, having high thermal conductivity and high thermal resistance can be used as the material of the insulating resin film 311, Thermal conductivity of the insulating resin film 311 is preferably made to be not lower than 3 W/(m·K). Due to fillers of alumina, aluminum nitride, or the like, contained in the insulating resin film 311, the thermal conductivity of the insulating resin film 311 can be improved. In addition, glass transition temperature of the insulating resin film 311 is preferably made to be not lower than 250° C. In addition, in the viewpoint of enhancing thermal conduction performance (increasing thermal conduction speed), the thickness of the insulating resin film 311 is preferably made to be not larger than 60 μm, and a variation of the thickness of the insulating resin film 311 is preferably made to be not larger than ±10%.

Figure 2C:
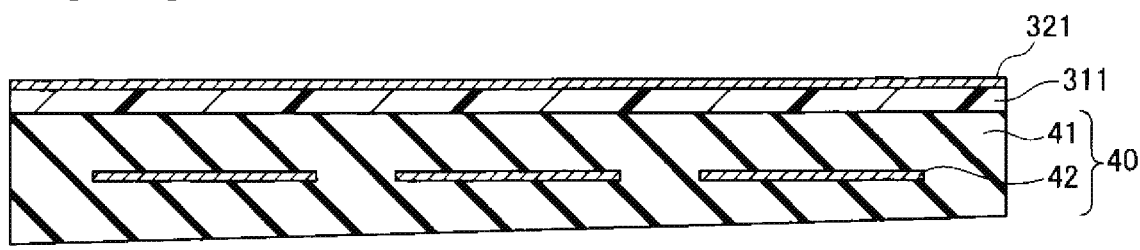

Next, in a step shown in FIG. 2C, a metal foil 321 is disposed on the insulating resin film 311. A rolled alloy exemplified as the material of heat generating elements 32 can be used as the material of the metal foil 321. Thickness of the metal foil 321 is preferably made to be not larger than 60 μm in consideration of wiring formability by etching. The metal foil 321 is temporarily fixed on the insulating resin film 311 by the pressure-sensitive adhesive force of the insulating resin film 311 which is in the semi-cured state.

Incidentally, at least one face (one or both of an upper face and a lower face) of the metal foil 321 is preferably roughened before the metal foil 321 is disposed on the insulating resin film 311. It is a matter of course that both of the upper face and the lower face of the metal foil 321 may be roughened. In this case, a roughening method used on the upper face of the metal foil 321 may be different from a roughening method used on the lower face of the metal foil 321. Each of the roughening methods is not limited particularly. A method using etching, a method using coupling agent-based surface modification technology, a method using dot processing by a UV-YAG laser having a wavelength not longer than 355 nm, etc. can be exemplified as the roughening method.

In addition, in the method using dot processing, necessary regions of the metal foil 321 can be roughened selectively. Therefore, in the method using dot processing, the entire region of the metal foil 321 does not have to be roughened, but it will go well as long as minimum regions left as heat generating elements 32 are roughened. That is, it is not necessary to roughen even regions which will be removed by etching.

Figure 2D:
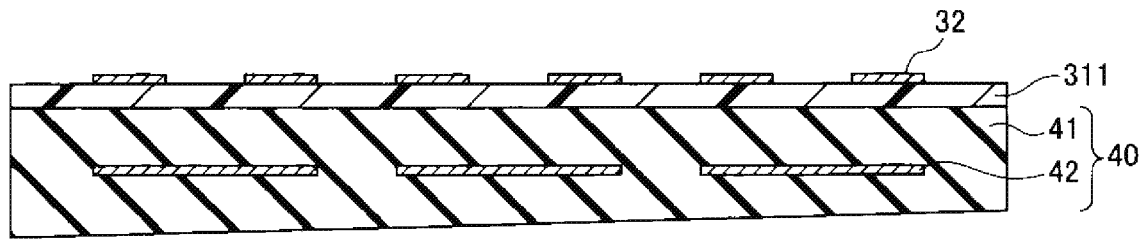

Next, in a step shown in FIG. 2D, the metal foil 321 is patterned so as to form the heat generating elements 32. Specifically, for example, a resist is formed all over the metal foil 321, and the resist is exposed to light and developed so that a resist pattern covering only the portions left as the heat generating elements 32 is formed. Next, portions of the metal foil 321 not covered with the resist pattern are removed by etching. For example, a cupric chloride etching solution, a ferric chloride etching solution, or the like, can be used as an etching solution for removing the metal foil 321.

Then, the resist pattern is stripped off by a stripping solution. Thus, the heat generating elements 32 are formed at predetermined positions on the insulating resin film 311 (photolithography). Since the heat generating elements 32 are formed by photolithography, a variation among widthwise dimensions of the heat generating elements 32 can be reduced so that a heat generation distribution can be improved. Incidentally, each of the heat generating elements 32 formed by etching can be, for example, substantially shaped like a trapezoidal in section. In this case, a difference between a wiring width of a face contacting the insulating resin film 311 and a wiring width of an opposite face thereto can be, for example, made to be about 10 μm to 50 μm. Due to the heat generating elements 32 each substantially shaped like as a simple trapezoid in section, the heat generation distribution can be improved.

Figure 3A:
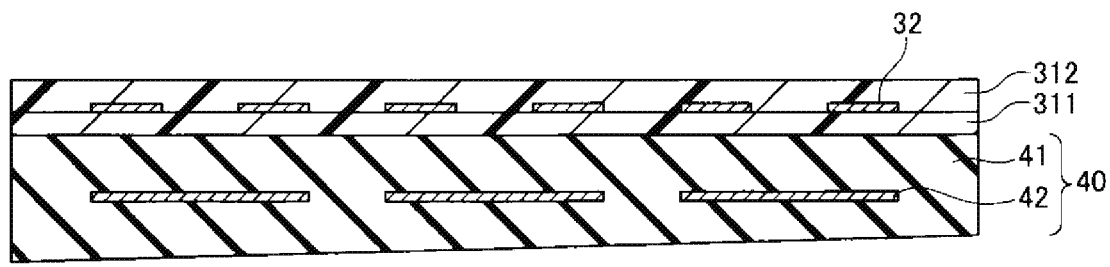
FIGS. 3A and 3B are views illustrating the method for manufacturing the substrate fixing apparatus according to the embodiment (Part 2)

Next, in a step shown in FIG. 3A, an insulating resin film 312 is laminated on the insulating resin film 311 to cover the heat generating elements 32. The insulating resin film 312 laminated in a vacuum is suitable in order to make it possible to suppress entrainment of voids. The material of the insulating resin film 312 can be, for example, made to be similar to or the same as that of the insulating resin film 311. However, thickness of the insulating resin film 312 can be determined suitably within a range in which the insulating resin film 312 can cover the heat generating elements 32. Accordingly, the thickness of the insulating resin film 312 does not always have to be the same as the thickness of the insulating resin film 311.

Figure 3B:
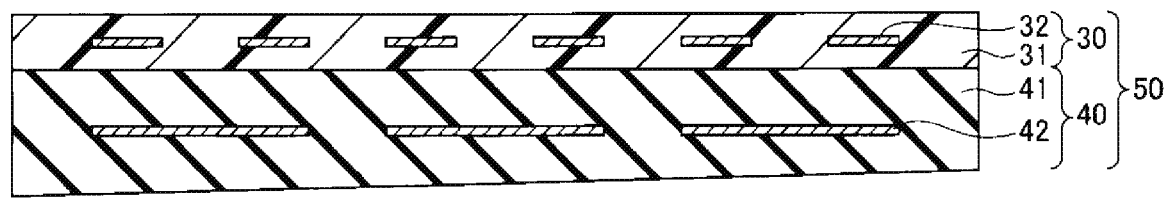

Next, in a step shown in FIG. 3B, the insulating resin films 311 and 312 are heated to a curing temperature or higher and cured while the insulating resin films 311 and 312 are pressed against the electrostatic chuck 40. Thus, the insulating resin films 311 and 312 are integrated into an insulating layer 31. A heating portion 30 in which the heat generating elements 32 are covered with the insulating layer 31 is formed so that the insulating layer 31 of the heating portion 30 and the electrostatic chuck 40 are directly bonded to each other. In consideration of stress when returning back to normal temperature, heating temperature of the insulating resin films 311 and 312 is preferably made to be not higher than 200° C.

Incidentally, the insulating resin films 311 and 312 are cured by heat while being pressed against the electrostatic chuck 40. Thus, irregularities of an upper face (a face on a side not contacting the electrostatic chuck 40) of the insulating layer 31 affected by presence/absence of the heat generating elements 32 can be reduced and flattened. The irregularities of the upper face of the insulating layer 31 are preferably made to be not larger than 7 μm. Since the irregularities of the upper face of the insulating layer 31 are made to be not larger than 7 μm, air bubbles can be prevented from being included between the insulating layer 31 and an adhesive layer 20 in a next step. That is, adhesiveness between the insulating layer 31 and the adhesive layer 20 can be prevented from deteriorating.

In this manner, an electrostatic adsorption member 50 can be produced.

Figure 4A:
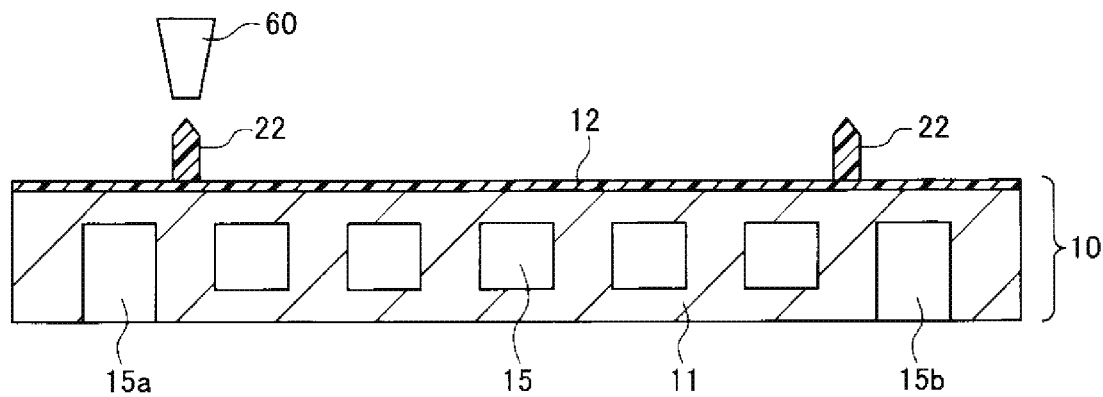
FIGS. 4A to 4C are views illustrating the method for manufacturing the substrate fixing apparatus according to the embodiment (Part 3)

As shown in FIG. 4A, separately from the electrostatic adsorption member 50, a base plate 10 is produced in the following manner. That is, a metal plate 11 where a water passage 15 or the like has been formed in advance is prepared, and a resin layer 12 is formed on the metal plate 11. Next, by use of a dispenser 60 or the like, columnar bodies 22 made of a resin which is the material of support column structure bodies 21 are formed in a semi-cured state (B-stage) at predetermined positions where the support column structure bodies 21 on the resin layer 12 will be formed. Next, by use of an oven or the like, the columnar bodies 22 are heated to a curing temperature or higher so as to be cured. The columnar bodies 22 are formed to be higher in height than the support column structure bodies 21.

Figure 4B:
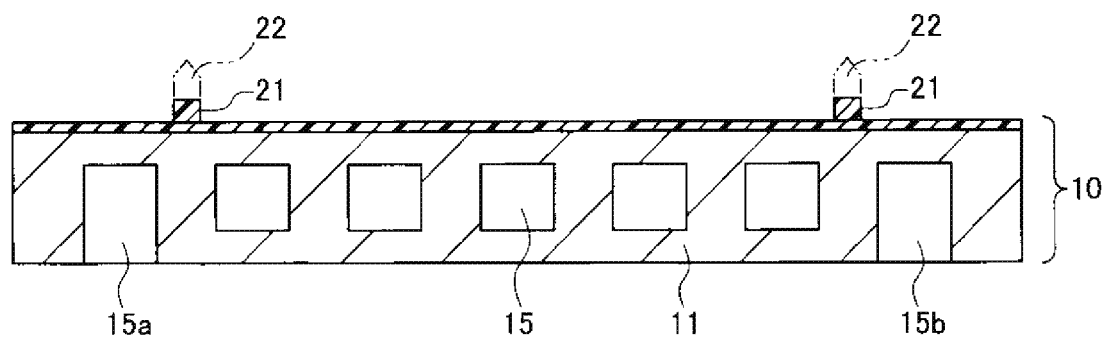

Next, as shown in FIG. 4B, by use of a grinding machine or the like, distal ends of the columnar bodies 22 are ground until the columnar bodies 22 become the heights of the support column structure bodies 21. As a result, the support column structure bodies 21 are obtained.

Figure 4C:
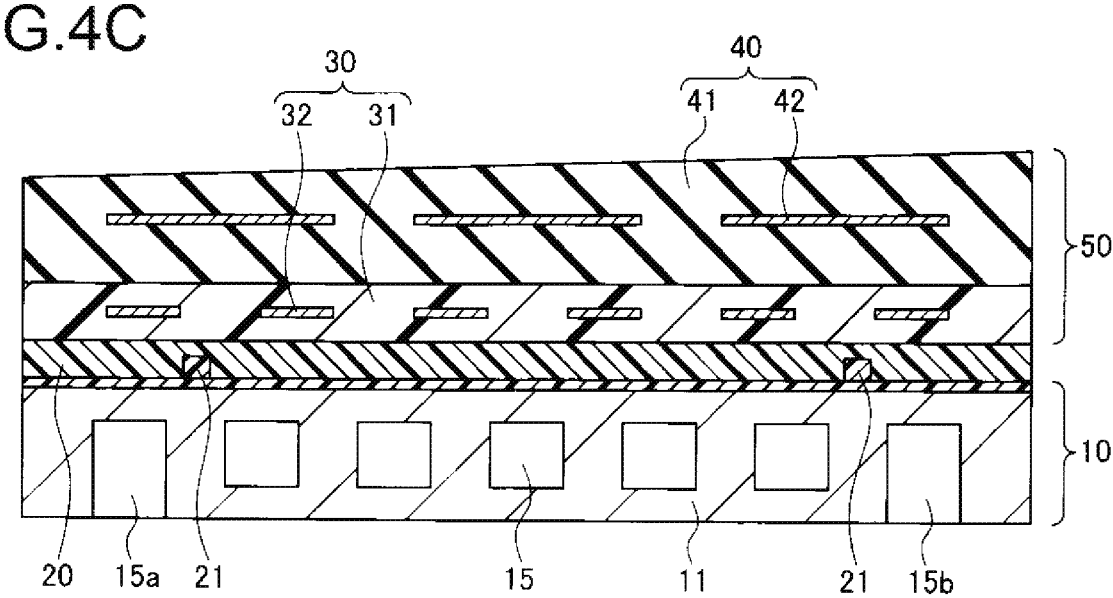

Next, as shown in FIG. 4C, the adhesive layer 20 is formed in a semi-cured state (B-stage) on the base plat 10. The electrostatic adsorption member 50 is inverted vertically, and the electrostatic adsorption member 50 is then disposed on the adhesive layer 20 so that the heating portion 30 faces the adhesive layer 20.

Figure 5A:
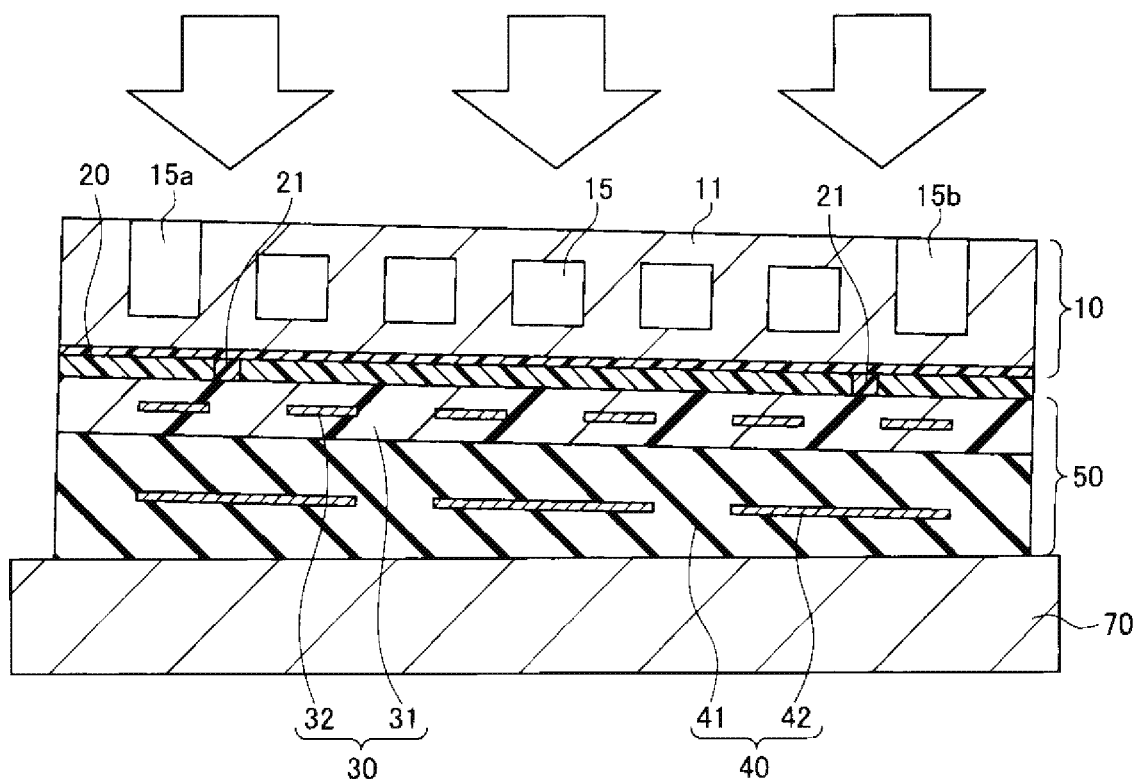
FIGS. 5A and 5B are views illustrating the method for manufacturing the substrate fixing apparatus according to the embodiment (Part 4)

Next, as shown in FIG. 5A, the resulting structure body shown in FIG. 4C is placed on a surface plate 70. During that time, the structure body shown in FIG. 4C is inverted vertically, and the structure body shown in FIG. 4C is then placed on the surface plate 70 so as to make an upper face of the electrostatic chuck 40 face an upper face of the surface plate 70. While a load is applied to a lower face of the metal plate 11, the adhesive layer 20 is heated to a curing temperature or higher by an oven or the like, so as to be cured. That is, the electrostatic adsorption member 50 and the base plate 10 are pressed while heated in order to cure the adhesive layer 20.

Figure 5B:
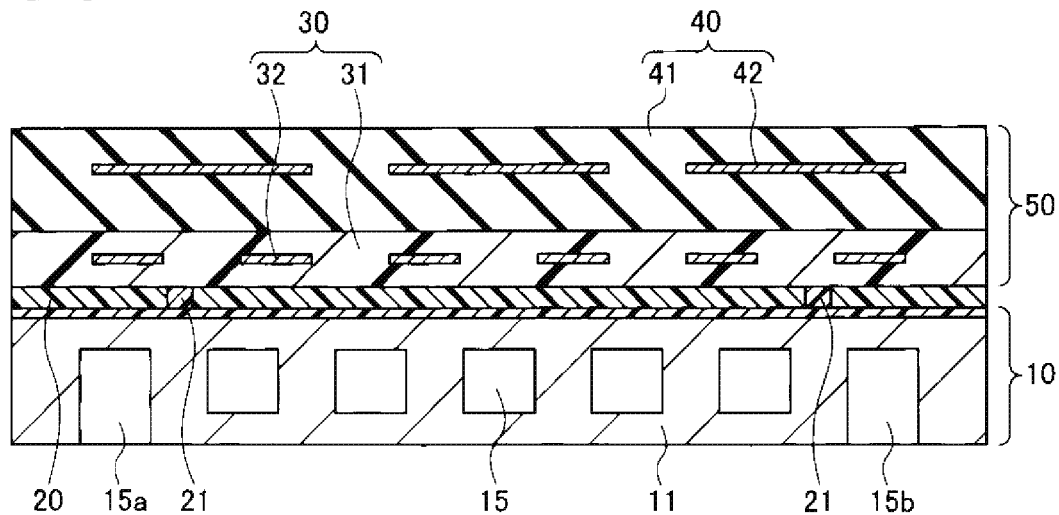

Next, the load is released. As shown in FIG. 5B, the upper face (adsorption face) of the electrostatic chuck 40 is ground so as to make the upper face of the electrostatic chuck 40 parallel with the lower face of the metal plate 11.

In this manner, the substrate fixing apparatus 1 can be manufactured.

In the present embodiment, the support column structure bodies 21 function as spacers between the base plate 10 and the electrostatic adsorption member 50 when the adhesive layer 20 is cured. Thus, excellent inplane uniformity of thickness of the adhesive layer 20 can be obtained. Accordingly, a variation of temperature in the adsorption face of the electrostatic chuck 40 can be suppressed so that an excellent uniform temperature characteristic can be obtained.

Although the number of the support column structure bodies 21 is not limited, for example, the support column structure bodies 21 are provided at least three points which are not on one and the same straight line in a plane perpendicular to a thickness direction of the substrate fixing apparatus 1. In this regard, for example, support column structure bodies 21 at twenty or more points may be alternatively disposed on the base plate 10. In addition, all the heights of the support column structure bodies 21 are the same. As a ratio occupied by the support column structure bodies 21 in the plane perpendicular to the thickness direction of the substrate fixing apparatus 1 is higher, uniformity of the thickness of the adhesive layer 20 can be enhanced so that an excellent uniform temperature characteristic can be obtained. On the other hand, as the ratio occupied by the support column structure bodies 21 in the plane perpendicular to the thickness direction of the substrate fixing apparatus 1 is lower, a ratio occupied by the adhesive layer 20 is higher so that adhesive force between the base plate 10 and the electrostatic adsorption member 50 is stronger. The ratio occupied by the support column structure bodies 21 in the plane perpendicular to the thickness direction of the substrate fixing apparatus 1 is preferably determined in consideration of these facts.

Figure 6A:
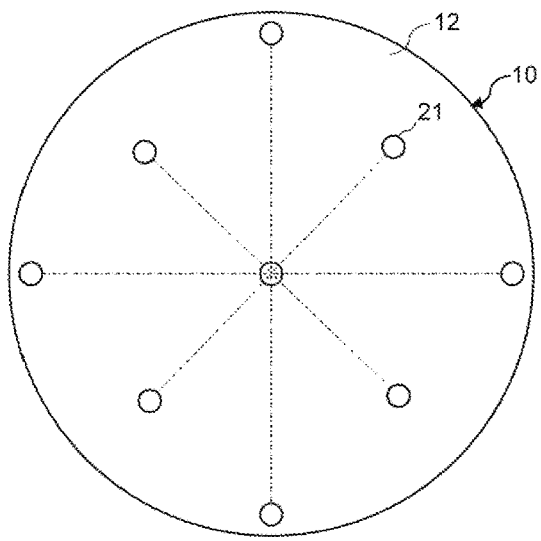
FIG. 6A illustrates a first example of the layout of the support column structure bodies which are disposed on the base plate.

In addition, the support column structure bodies 21 may be disposed in a point symmetry with respect to a center point of the base plate 10 (see FIG. 6A). In this case, uniformity of the thickness of the adhesive layer 20 can be enhanced. Further, the diameter of each of the support column structure bodies 21 may be in the range of from 3 mm to 10 mm.

Figure 6B:
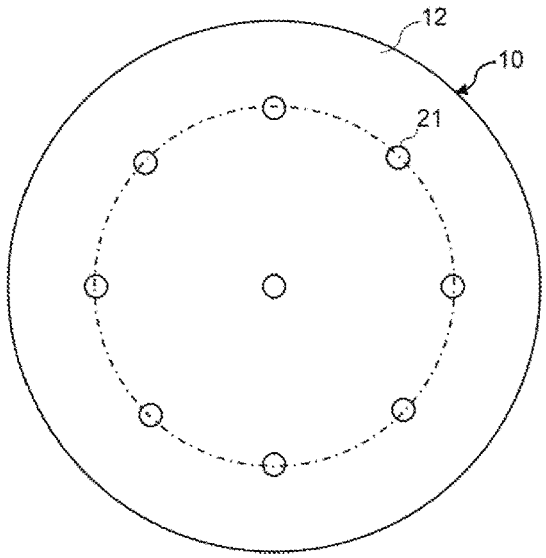
FIG. 6B illustrates a second example of the layout of the support column structure bodies which are disposed on the base plate.
Figure 6C:
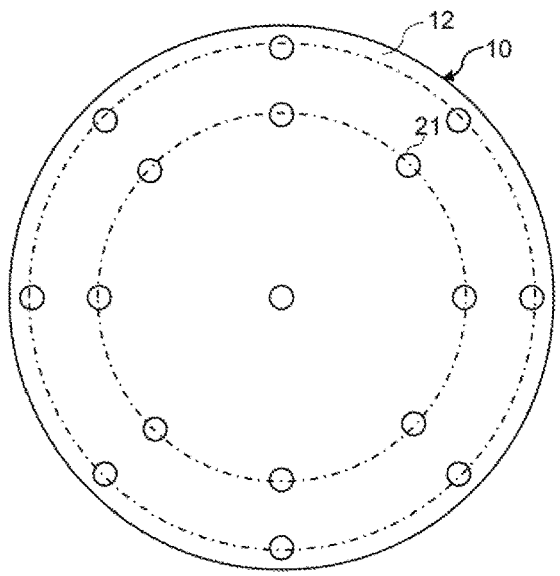
FIG. 6C illustrates a third example of the layout of the support column structure bodies which are disposed on the base plate.

Further, as shown in FIG. 6B, the support column bodies 21 may be disposed on the center point of the base plate 10 and on the circumference of a circle whose center corresponds to the center point of the base plate 10. As shown in FIG. 6C, the support column bodies 21 may be disposed on the center point of the base plate 10 and on the circumferences of two concentric circles each whose center corresponds to the center point of the base plate 10.

The materials of the adhesive layer 12, the adhesive layer 20 and the support column structural bodies 21 are not limited. For example, a silicone resin, an epoxy resin, an acrylic resin and a polyimide resin are listed as the materials of the adhesive layer 12, the adhesive layer 20 and the support column structure bodies 21. Composite materials of those resins may be used for the resin layer 12, the adhesive layer 20 and the support column structure bodies 21, As described above, an elastic modulus of the support column structure bodies 21 is higher than an elastic modulus of the adhesive layer 20. Accordingly, a mean molecular weight of the resin of the support column structure bodies 21 is preferably higher than a mean molecular weight of the resin of the adhesive layer 20. In addition, the number of crosslinking points of the resin of the support column structure bodies 21 is preferably larger than the number of crosslinking points of the resin of the adhesive layer 20. In addition, fillers may be contained in the adhesive layer 20 and the support column structure bodies 21. The support column structure bodies 21 preferably contain a larger amount of the fillers than the adhesive layer 20. Alternatively, the support column structure bodies 21 may contain the fillers while the adhesive layer 20 does not contain the fillers. Silica, alumina, aluminum nitride, etc. are listed as examples of the material of the fillers.

In addition, an elastic modulus of the resin layer 12 is preferably higher than the elastic modulus of the adhesive layer 20. This is to maintain the thickness of the adhesive layer 20 uniformly. The mean molecular weight of the resin of the resin layer 12 is preferably higher than the mean molecular weight of the resin of the resin layer 20. In addition, the number of crosslinking points of the resin of the resin layer 12 is preferably larger than the number of the crosslinking points of the resin of the adhesive layer 20. In addition, fillers may be contained in the resin layer 12. The resin layer 12 preferably contains a larger amount of the fillers than the adhesive layer 20. The resin layer 12 may contain the fillers while the adhesive layer 20 does not contain the fillers.

A difference between thermal conductivity of the support column structure bodies 21 and thermal conductivity of the adhesive layer 20 is preferably small, e.g. not higher than 2 W/(m·K), more preferably not higher than 1 W/(m·K). This is to obtain an excellent uniform temperature characteristic in the adsorption face. Thermal conductivity of the resin layer 12 is not limited. It is possible to suitably select the material of the resin layer 12 in accordance with the thermal conductivity required in the substrate fixing apparatus 1.

A coefficient of thermal expansion of the support column structure bodies 21 is preferably on the same level as a coefficient of thermal expansion of the adhesive layer 20, e.g. not smaller than 0.1 times and not larger than 10 times as high as the coefficient of thermal expansion of the adhesive layer 20. This is to obtain excellent shape stability during heating.

The surface of the metal plate 11 may be insulated by alumina spraying etc. By the insulation treatment, electric discharge between the metal plate 11 and the electrostatic electrodes 42 can be suppressed more surely.

The heat generating elements 32 may be built in the base body 41 without provision of the insulating layer 31. In addition, the heating portion 30 may be dispensed with. In these cases, the adhesive layer 20 adhesively bonds the base body 41 to the base plate 10.

Although the preferred embodiment etc. has been described above in detail, the present disclosure is not limited to the aforementioned embodiment etc. and various modifications and replacements can be added to the aforementioned embodiment etc. without departing from the scope stated in claims.

Various aspects of the subject matter described herein are set out non-exhaustively in the following numbered clauses:

1) A method for manufacturing a substrate fixing apparatus,
the method comprising:
providing a semi-cured adhesive layer and a support member between an electrostatic adsorption member and a base plate, wherein the electrostatic adsorption member is configured to adsorb and retain a substrate, and the support member is configured to support the electrostatic adsorption member; and
pressing and heating the electrostatic adsorption member and the base plate so as to cure the adhesive layer;
wherein
the support member directly contacts the base plate and the electrostatic adsorption member, and
an elastic modulus of the support member is higher than an elastic modulus of the adhesive layer.

2) The method according to Clause (1), wherein
the elastic modulus of the support member is ten or more times as high as the elastic modulus of the adhesive layer.

3) The method according to Clause (1), wherein
a difference between thermal conductivity of the support member and thermal conductivity of the adhesive layer is not higher than 2W/(m·K).

4) The method according to Clause (1), wherein a coefficient of thermal expansion of the support member is not smaller than 0.1 and not larger than 10 times as high as a coefficient of thermal expansion of the adhesive layer.

5) The method according to Clause (1), further comprising: grinding an adsorption face of the electrostatic adsorption member after curing the adhesive layer.

What is claimed is:

1. A substrate fixing apparatus comprising:
a base plate;
an electrostatic adsorption member that adsorbs and retains a substrate;
a plurality of support members that are disposed on the base plate to support the electrostatic adsorption member; and
an adhesive layer that adhesively bonds the electrostatic adsorption member to the base plate,
wherein
each of the plurality of support members directly contacts the base plate and the electrostatic adsorption member,
an elastic modulus of each of the plurality of support members is higher than an elastic modulus of the adhesive layer, and
heights of the plurality of support members are substantially the same.

2. The substrate fixing apparatus according to claim 1, wherein
the elastic modulus of each of the plurality of support members is ten or more times as high as the elastic modulus of the adhesive layer.

3. The substrate fixing apparatus according to claim 1, wherein
the electrostatic adsorption member comprises an electrostatic chuck.

4. The substrate fixing apparatus according to claim 3, wherein
the electrostatic adsorption member further comprises a heating portion between the base plate and the electrostatic chuck.

5. The substrate fixing apparatus according to claim 1, wherein the base plate comprises:

a metal base body, and a resin layer that is provided on the metal base body and between the metal base body and the electrostatic adsorption member.

6. The substrate fixing apparatus according to claim 5, wherein each of the plurality of support members directly contacts the resin layer.

7. The substrate fixing apparatus according to claim 1, wherein a difference between thermal conductivity of each of the plurality of support members and thermal conductivity of the adhesive layer is not higher than 2 W/(m·K).

8. The substrate fixing apparatus according to claim 1, wherein a coefficient of thermal expansion of each of the plurality of support members is not smaller than 0.1 time and not larger than 10 times as high as a coefficient of thermal expansion of the adhesive layer.

9. The substrate fixing apparatus according to claim 1, wherein the adhesive layer is provided between the electrostatic adsorption member and the base plate so as to cover the plurality of support members.

10. The substrate fixing apparatus according to claim 1, wherein the plurality of support members are disposed in a point symmetry with respect to a center point of the base plate.

* * * * *